(12) United States Patent
Cao et al.

(10) Patent No.: US 11,156,680 B2
(45) Date of Patent: Oct. 26, 2021

(54) ASSEMBLED NUCLEAR MAGNETIC RESONANCE SAMPLE TUBE AND ASSEMBLY METHOD THEREOF

(71) Applicant: Jiangsu Normal University, Xuzhou (CN)

(72) Inventors: Changsheng Cao, Xuzhou (CN); Yanhui Shi, Xuzhou (CN)

(73) Assignee: JIANGSU NORMAL UNIVERSITY, Xuzhou (CN)

( * ) Notice: Subject to any disclaimer, the term of this patent is extended or adjusted under 35 U.S.C. 154(b) by 0 days.

(21) Appl. No.: 16/831,143

(22) Filed: Mar. 26, 2020

(65) Prior Publication Data

US 2021/0072329 A1 Mar. 11, 2021

(30) Foreign Application Priority Data

Sep. 6, 2019 (CN) .......................... 201910842386.3

(51) Int. Cl.
*G01R 33/30* (2006.01)
(52) U.S. Cl.
CPC .................................... *G01R 33/30* (2013.01)
(58) Field of Classification Search
CPC ...................................................... G01R 33/30
USPC ......................................................... 324/321
See application file for complete search history.

(56) References Cited

U.S. PATENT DOCUMENTS

| | | | |
|---|---|---|---|
| 5,080,868 A | 1/1992 | Elgas | |
| 7,119,542 B1 * | 10/2006 | Howard | G01R 33/307 324/321 |
| 7,557,578 B1 * | 7/2009 | Zens | G01R 33/30 324/318 |
| 2004/0090231 A1 * | 5/2004 | Augustine | G01N 24/08 324/309 |
| 2005/0024055 A1 * | 2/2005 | Cavaluzzi | G01R 33/30 324/321 |
| 2009/0072829 A1 * | 3/2009 | Norell | G01R 33/30 324/321 |
| 2009/0128151 A1 * | 5/2009 | Norell | G01R 33/30 324/321 |
| 2012/0146636 A1 * | 6/2012 | Hoyt | G01R 33/307 324/307 |
| 2014/0044598 A1 * | 2/2014 | Hu | B23G 1/02 422/68.1 |

(Continued)

FOREIGN PATENT DOCUMENTS

CN 107835715 A 3/2018

*Primary Examiner* — Christopher P McAndrew
(74) *Attorney, Agent, or Firm* — WPAT, PC

(57) ABSTRACT

The present disclosure discloses a novel assembled nuclear magnetic resonance (NMR) sample tube and an assembly method thereof. The structure includes a common NMR sample tube, a first open-top screw cap and a second open-top screw cap. The first screw cap is sleeved on the common NMR sample tube, and an open end of the first screw cap is tightly connected to an outer wall of the common NMR sample tube. The second screw cap is in threaded connection with the screw thread on the top of the short tube. A short tube is sleeved on the common NMR sample tube, and the screw thread at the bottom of the short tube is in threaded connection with the first screw cap. A silicone rubber septum is located between the open end of the second screw cap and the screw thread on the top of the short tube.

15 Claims, 3 Drawing Sheets

(56) References Cited

U.S. PATENT DOCUMENTS

| | | | | |
|---|---|---|---|---|
| 2016/0047867 A1* | 2/2016 | Turcu | ................... | G01R 33/307 |
| | | | | 324/321 |
| 2016/0363639 A1* | 12/2016 | Norell | ................... | G01R 33/30 |
| 2017/0266624 A1* | 9/2017 | Shibata | ................. | B01D 71/24 |
| 2019/0324099 A1* | 10/2019 | Fujiwara | .............. | G01R 33/307 |

* cited by examiner

ASSEMBLED NUCLEAR MAGNETIC RESONANCE SAMPLE TUBE AND ASSEMBLY METHOD THEREOF

TECHNICAL FIELD

The present invention relates to the technical field of nuclear magnetic instruments, and in particular, to a novel assembled nuclear magnetic resonance (NMR) sample tube and an assembly method thereof.

BACKGROUND

A screw-cap NMR sample tube is a special glass instrument used to prepare and temporarily store water-free and oxygen-free nuclear magnetic samples and test samples on a nuclear magnetic instrument. A syringe can be used to charge liquid substances and deuterated reagents to the NMR sample tube or aspirate them through a septum in a headspace cap on the sample tube. The price of a commonly used NMR sample tube is only a few dozen to several tens of yuan, but the screw-cap NMR sample tube is usually at a high price, with each tube up to several hundred yuan. This greatly limits popularity and use of the screw-cap NMR sample tube.

It is very important if a common NMR sample tube could be used to replace the screw-cap NMR sample tube to perform operation. However, there is currently no appropriate related technology.

SUMMARY

An objective of the present invention is to provide a novel assembled nuclear magnetic resonance (NMR) sample tube and an assembly method thereof, to solve the problems in the prior art. A common NMR sample tube is assembled to replace a screw-cap NMR sample tube, with same technical effects and reduced costs.

To achieve the above objective, the present invention provides the following solution.

The present invention provides a novel assembled NMR sample tube, including a common NMR sample tube, and a first open-top screw cap and a second open-top screw cap. The first screw cap is sleeved on the common NMR sample tube, and an open end of the first screw cap is tightly connected to an outer wall of the common NMR sample tube through an O-shaped rubber ring. A short tube is sleeved on the common NMR sample tube, two ends of the short tube are provided with screw threads, and the screw thread at the bottom of the short tube is in threaded connection with the first screw cap. The top of the common NMR sample tube is flush with the top of the screw thread at the upper end of the short tube, and the screw thread the top of the short tube is sealed with a silicone rubber septum. The second screw cap is in threaded connection with the screw thread on the top of the short tube. The silicone rubber septum is located between the open end of the second screw cap and the screw thread on the top of the short tube.

Optionally, a length of the short tube is 15-30 mm, and an outer diameter of a middle portion of the short tube is 12 mm.

Optionally, the screw threads on both ends of the short tube are 8-425 screw threads, and the first screw cap and the second screw cap both are 8-425 open-top screw caps.

Optionally, the O-shaped rubber ring has an inner diameter of 4.5 mm and a wall thickness of 1.78 mm; and the wall thickness of the O-shaped rubber ring is the thickness between the outer diameter and the inner diameter of the O-shaped rubber ring.

Optionally, the common NMR sample tube is an NMR sample tube with an outer diameter of 5 mm.

Optionally, an outer diameter of the silicone rubber septum is 8 mm, and one side of the silicone rubber septum is made of polytetrafluoroethylene.

The present invention further provides an assembly method of the novel assembled NMR sample tube, including the following steps:

step 1: downwardly sleeving a top open end of a first screw cap on a common NMR sample tube, and sleeving an O-shaped rubber ring on the common NMR sample tube;

step 2: sleeving a short tube on the common NMR sample tube, and loosely screwing a screw thread at the lower end of the short tube into the first screw cap;

step 3: adjusting positions of the short tube, the O-shaped rubber ring and the first screw cap on the common NMR sample tube until an upper edge of a screw thread on the top of the short tube is flush with the top of the common NMR sample tube, and then tightening the first screw cap, so that the short tube, the first screw cap and the O-shaped rubber ring are tightly fixed on the common NMR sample tube; and step 4: placing a silicone rubber septum on the screw thread on the top of the short tube, then screwing a second screw cap into the screw thread on the top of the short tube until a top opening of the second screw cap is internally tightly connected to the silicon rubber septum, and an upper end of the common NMR sample tube is tightly bonded to the silicone rubber septum to complete assembly.

The present invention achieves the following technical effects compared with the prior art.

In the present invention, a common NMR sample tube is used to replace a screw-cap NMR sample tube, to achieve the same technical effects and good sealing performance. The present invention reduces funds of scientific researchers; in addition, the present invention can prepare a water-free and oxygen-free sample by using a common NMR sample tube combined with a water-free and oxygen-free method, making the storage time of the sample longer, not easily oxidized, and making the spectrogram of the measured sample cleaner. A maximum sealing for each solvent can be achieved. Meanwhile, compared with an NMR sample tube with a screw thread, the present invention has no dead zone.

BRIEF DESCRIPTION OF THE DRAWINGS

To describe the technical solutions in the embodiments of the present invention or in the prior art more clearly, the following briefly introduces the accompanying drawings required for describing the embodiments. Apparently, the accompanying drawings in the following description show merely some embodiments of the present invention, and a person of ordinary skill in the art may still derive other accompanying drawings from these accompanying drawings without creative efforts.

In the figures: 1. a common NMR sample tube, 2. a first screw cap, 3. a second screw cap, 4. an O-shaped rubber ring, 5. a short tube, 5-1. a screw thread, and 6. a silicone rubber septum.

DETAILED DESCRIPTION

The following clearly and completely describes the technical solutions in the embodiments of the present invention with reference to accompanying drawings in the embodiments of the present invention. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

The objective of the present invention is to provide a novel assembled NMR sample tube and an assembly method thereof, in order to solve the problems existing in the above-mentioned prior art. A common NMR sample tube is assembled to replace a screw-cap NMR sample tube, with same technical effects and reduced costs.

In order to make the above objects, features, and advantages of the present invention more apparent, the present invention will be further described in detail in connection with the accompanying drawings and the detailed description.

Embodiment 1

Figure 1:
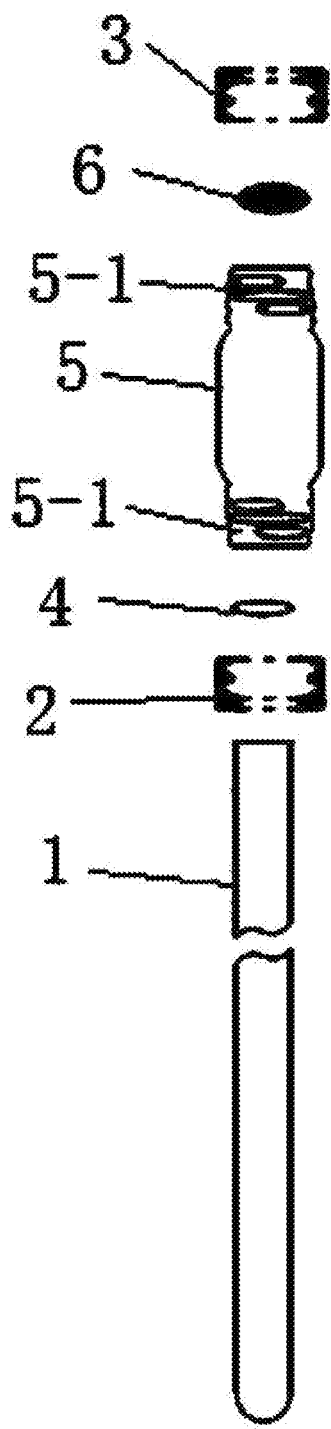
FIG. 1 is an exploded view of components of a novel assembled NMR sample tube according to the present invention.
Figure 2:
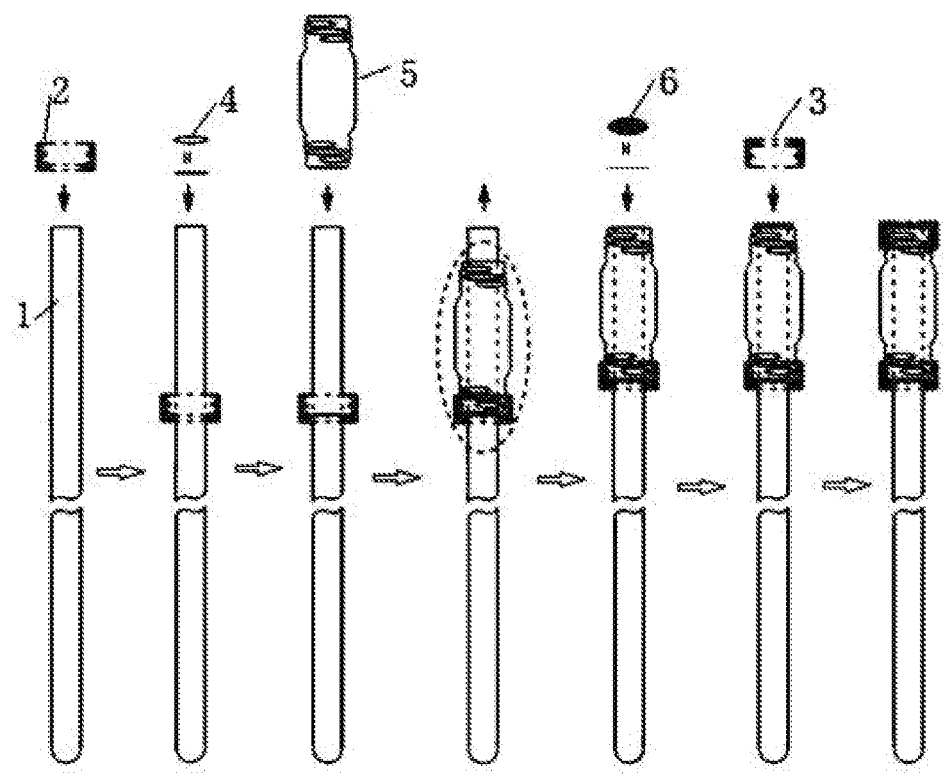
FIG. 2 is a schematic diagram of an assembly process of a novel assembled NMR sample tube according to the present invention.
Figure 3:
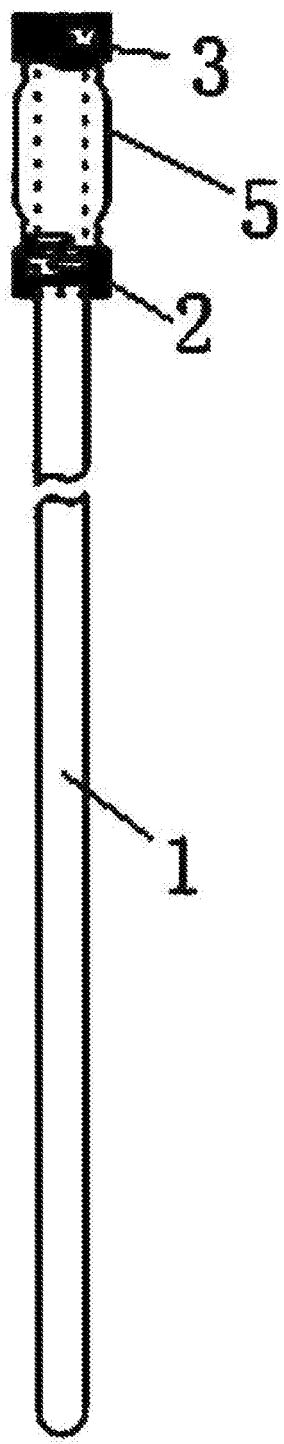
FIG. 3 is a schematic diagram of an integral structure of a novel assembled NMR sample tube according to the present invention.

The present invention provides a novel assembled NMR sample tube, as shown in FIG. 1 to FIG. 3. The novel assembled NMR sample tube includes a common NMR sample tube 1, that is, an NMR sample tube; and further includes a first open-top screw cap 2 and a second open-top screw cap 3. The first screw cap 2 is sleeved on the common NMR sample tube 1 in a manner where an open end on the top of the first screw cap 2 is downward and a threaded end is upward, and the open end of the first screw cap 2 can be tightly connected to an outer wall of the common NMR sample tube 1 through an O-shaped rubber ring 4. A short tube 5 is sleeved on the common NMR sample tube 1, two ends of the short tube 5 are provided with screw threads 5-1, and the screw thread 5-1 at the bottom of the short tube 5 is in threaded connection with the first screw cap 2. The top of the common NMR sample tube 1 is flush with the top of the screw thread 5-1 at the upper end of the short tube 5, and the screw thread 5-1 on the top of the short tube 5 is sealed with a silicone rubber septum 6. The second screw cap 3 is in threaded connection with the screw thread 5-1 on the top of the short tube. The silicone rubber septum 6 is located between the open end of the second screw cap 3 and the screw thread 5-1 on the top of the short tube 5, and is in tight and sealing connection with the screw thread 5-1 on the top of the short tube 5 after being compressed by the open end on the top of the second screw cap 3.

Specifically, a length of the short tube 5 is 15-30 mm, and an outer diameter of a middle portion of the short tube 5 is 12 mm. The screw threads 5-1 on both ends of the short tube 5 are 8-425 screw threads, and the first screw cap 2 and the second screw cap 3 both are 8-425 open-top screw caps. The O-shaped rubber ring 4 has an inner diameter of 4.5 mm and a wall thickness of 1.78 mm. The common NMR sample tube 1 is an NMR sample tube with an outer diameter of 5 mm. An outer diameter of the silicone rubber septum 6 is 8 mm, and one side of the silicone rubber septum 6 is made of polytetrafluoroethylene.

The present invention further provides an assembly method of the novel assembled NMR sample tube, including the following steps:

step 1: downwardly sleeving a top open end of a first screw cap 2 on a common NMR sample tube 1, and sleeving an O-shaped rubber ring 4 on the common NMR sample tube 1;

step 2: sleeving a short tube 5 on the common NMR sample tube 1, and loosely screwing a screw thread at the lower end of the short tube into the first screw cap; adjusting positions of the short tube 5, the O-shaped rubber ring 4 and the first screw cap 2 on the common NMR sample tube 1 until an upper edge of a screw thread 5-1 on the top of the short tube 5 is flush with the top of the common NMR sample tube 1;

step 3: tightening the first screw cap 2 and the screw thread 5-1 on the top of the short tube 5, so that the short tube 5, the first screw cap 2 and the O-shaped rubber ring 4 are tightly fixed on the common NMR sample tube 1. Specifically, the inner diameter of the elastic O-shaped rubber ring 4 is smaller than the outer diameter of the common NMR sample tube 1, so the O-shaped rubber ring 4 can be fixedly sleeved on the common NMR sample tube 1. When the screw thread 5-1 at the lower portion of the short tube 5 is screwed tightly with the first screw cap 2, the O-shaped rubber ring 4 is squeezed between the screw thread 5-1 at the lower portion of the short tube 5 and the first screw cap 2 to cause deformation. So that the screw thread 5-1 at the lower portion of the short tube 5 is fixed with the first screw cap 2 and the O-shaped rubber ring 4, and is tightly connected to the common NMR sample tube 1.

step 4: placing a silicone rubber septum 6 on the screw thread 5-1 on the top of the short tube 5, then screwing a second screw cap 3 into the screw thread 5-1 on the top of the short tube 5 until a top opening of the second screw cap 3 is internally tightly connected to the silicon rubber septum 6, to complete assembly; and after the assembly is completed, it can replace the screw-cap NMR sample tube with a 8-425 screw thread, and has all functions of the screw-cap NMR sample tube with a 8-425 screw thread.

Embodiment 2

This embodiment is a further improvement made on the basis of Embodiment 1, and includes all technical solutions of Embodiment 1. On the basis of Embodiment 1, a common NMR sample tube 1 with a 5 mm outer diameter is replaced as a common NMR sample tube 1 with a 10 mm outer diameter, so that the replaced NMR sample tube with a 10 mm outer diameter is assembled to replace a screw cap NMR sample tube with a 15-425 screw thread. At this time, the inner diameter of the O-shaped rubber ring 4 is 9.2 mm, the wall thickness is 1.78 mm, the length of the short tube 5 is 15-30 mm, and the outer diameter of the silicone rubber septum 6 is 15 mm. At this time, the screw thread of the first screw cap 2 and the second screw cap 3 is changed from 8-425 in Embodiment 1 to 15-425, and the overall assembly method is the same as that in Embodiment 1. The present invention can also assemble other type of NMR sample tubes on this basis, which are not listed herein one by one.

Several examples are used for illustration of the principles and implementation methods of the present invention. The description of the embodiments is used to help illustrate the method and its core principles of the present invention. In addition, those skilled in the art can make various modifications in terms of specific embodiments and scope of application in accordance with the teachings of the present invention. In conclusion, the content of this specification shall not be construed as a limitation to the present invention.

What is claimed is:

1. A novel assembled nuclear magnetic resonance (NMR) sample tube, comprising a common NMR sample tube, a first open-top screw cap and a second open-top screw cap, wherein the first open-top screw cap is sleeved on an outer wall of the common NMR sample tube, and an open end of the first open-top screw cap is tightly connected to the outer wall of the common NMR sample tube through an O-shaped rubber ring and thereby the first open-top screw cap is located outside the common NMR sample tube; a short tube is sleeved on the outer wall of the common NMR sample tube and thereby located outside the common NMR sample tube, two ends of the short tube are provided with screw-thread ends, and the screw-thread end at the bottom of the short tube is in threaded connection with the first open-top screw cap; the top of the common NMR sample tube is flush with the top of the screw-thread end at the upper end of the short tube, and the screw-thread end on the top of the short tube is provided with a silicone rubber septum; the second open-top screw cap is in threaded connection with the screw-thread end on the top of the short tube; and the silicone rubber septum is located between the open end of the second open-top screw cap and the screw-thread end on the top of the short tube;

wherein an outer diameter of a middle portion of the short tube is larger than an outer diameter of the common NMR sample tube.

2. The novel assembled NMR sample tube according to claim 1, wherein a length of the short tube is 15-30 mm, and an outer diameter of a middle portion of the short tube is 12 mm.

3. The novel assembled NMR sample tube according to claim 1, wherein the screw-thread ends on both ends of the short tube are 8-425 screw-thread ends, and the first open-top screw cap and the second open-top screw cap both are 8-425 open-top screw caps.

4. The novel assembled NMR sample tube according to claim 1, wherein the O-shaped rubber ring has an inner diameter of 4.5 mm and a wall thickness of 1.78 mm.

5. The novel assembled NMR sample tube according to claim 1, wherein the common NMR sample tube is an NMR sample tube with an outer diameter of 5 mm.

6. The novel assembled NMR sample tube according to claim 1, wherein an outer diameter of the silicone rubber septum is 8 mm, and one side of the silicone rubber septum is made of polytetrafluoroethylene.

7. An assembly method of a novel assembled NMR sample tube, comprising the following steps:

step 1: downwardly sleeving a top open end of a first open-top screw cap on an outer wall of a common NMR sample tube, and sleeving an O-shaped rubber ring on the outer wall of the common NMR sample tube, wherein the first open-top screw cap and the O-shaped rubber ring both are located outside the common NMR sample tube;

step 2: sleeving a short tube on the outer wall of the common NMR sample tube and thereby the short tube is located outside the common NMR sample tube, and loosely screwing a screw-thread end at the lower end of the short tube into the first open-top screw cap, wherein an outer diameter of a middle portion of the short tube is larger than an outer diameter of the common NMR sample tube;

step 3: adjusting positions of the short tube, the O-shaped rubber ring and the first open-top screw cap on the common NMR sample tube until an upper edge of a screw-thread end on the top of the short tube is flush with the top of the common NMR sample tube, and then tightening the first open-top screw cap, so that the short tube, the first open-top screw cap and the O-shaped rubber ring are tightly fixed on the common NMR sample tube; and step 4: placing a silicone rubber septum at the screw-thread end on the top of the short tube, then screwing a second open-top screw cap into the screw-thread end on the top of the short tube until a top opening of the second open-top screw cap is internally tightly connected to the silicon rubber septum, and an upper end of the common NMR sample tube is tightly bonded to the silicone rubber septum to complete assembly.

8. An assembled nuclear magnetic resonance (NMR) sample tube, comprising: an NMR sample tube, a first open-top screw cap and a second open-top screw cap;

wherein the first open-top screw cap is sleeved on an outer wall of the NMR sample tube and thereby located outside the NMR sample tube, the first open-top screw cap comprises a downward open end and an upward internally-threaded end, the downward open end is connected to the outer wall of the NMR sample tube through an O-shaped rubber ring and whereby the O-shaped rubber ring is sandwiched between the first open-top screw cap and the outer wall of the NMR sample tube;

wherein a short tube is sleeved on the outer wall of the NMR sample tube and thereby located outside the NMR sample tube, the short tube is provided with an upper screw-thread end and a lower screw-thread end, the lower screw-thread end is in threaded connection with the upward internally-threaded end of the first open-top screw cap, and the upper screw-thread end is provided with a septum;

wherein the second open-top screw cap comprises an upward open end and a downward internally-threaded end, the downward internally-threaded end is in threaded connection with the upper screw-thread end of the short tube and whereby the septum is located between the upward open end and the upper screw-thread end of the short tube.

9. The assembled NMR sample tube according to claim 8, wherein an outer diameter of the septum is 8 mm when the upper screw-thread end and the lower screw-thread end of the short tube are 8-425 screw-thread ends, or the outer diameter of the septum is 15 mm when the upper screw-thread end and the lower screw-thread end of the short tube are 15-425 screw-thread ends.

10. The assembled NMR sample tube according to claim 8, wherein the NMR sample tube is a glass tube with one closed end and configured for preparing a water-free and oxygen-free sample.

11. The assembled NMR sample tube according to claim 8, wherein the septum allows a syringe to charge liquid substances and deuterated reagents to the NMR sample tube.

12. The novel assembled NMR sample tube according to claim 1, wherein the silicone rubber septum allows a syringe to charge liquid substances and deuterated reagents to the common NMR sample tube.

13. The novel assembled NMR sample tube according to claim 1, wherein the common NMR sample tube is a glass tube with one closed end and configured for preparing a water-free and oxygen-free sample.

14. The assembly method of a novel assembled NMR sample tube according to claim 7, wherein the silicone rubber septum allows a syringe to charge liquid substances and deuterated reagents to the common NMR sample tube.

15. The assembly method of a novel assembled NMR sample tube according to claim 7, wherein the common NMR sample tube is a glass tube with one closed end and configured for preparing a water-free and oxygen-free sample.

* * * * *